United States Patent [19]

Mosier

[11] Patent Number: 4,660,036
[45] Date of Patent: Apr. 21, 1987

[54] AMPLIFIED MOTION ENCODER

[75] Inventor: Donald E. Mosier, Cedar Rapids, Iowa

[73] Assignee: Rockwell International Corporation, El Segundo, Calif.

[21] Appl. No.: 734,998

[22] Filed: May 17, 1985

[51] Int. Cl.⁴ ............................................. G08C 19/36
[52] U.S. Cl. ............................. 340/870.29; 33/1 PT; 250/231 SE
[58] Field of Search .......... 33/1 PT; 340/688, 347 M, 340/870.29; 250/231 SE

[56] References Cited

U.S. PATENT DOCUMENTS

| | | | |
|---|---|---|---|
| 2,993,200 | 7/1961 | Walker et al. | 33/1 PT |
| 3,096,444 | 7/1963 | Seward | 33/1 PT |
| 4,263,506 | 4/1981 | Epstein | 250/231 SE |
| 4,421,980 | 12/1983 | Kuhne | 250/231 SE |

Primary Examiner—Jerry W. Myracle
Attorney, Agent, or Firm—Robert C. Mayes; George A. Montanye; H. Fredrick Hamann

[57] ABSTRACT

A single turn absolute position encoder is disclosed capable of being manufactured in extremely small size while maintaining high resolution. An indented version having a discrete position output signal is disclosed as well as a non-indented continuous position output device having an index for coarse position location as well as apertures for fine position location. This device may be designed for extremely high resolution in a single turn device, or may be geared to further improve resolution.

5 Claims, 18 Drawing Figures

COMBINED APERTURES AND SENSORS

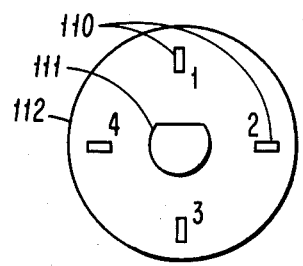
FIG 1a
TURNING APERTURE WHEEL
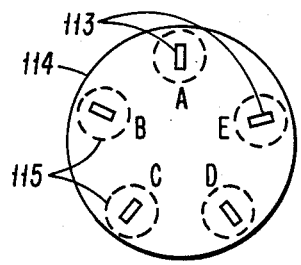
FIG 1b
STATIONARY APERTURE WHEEL AND SENSOR BOARD
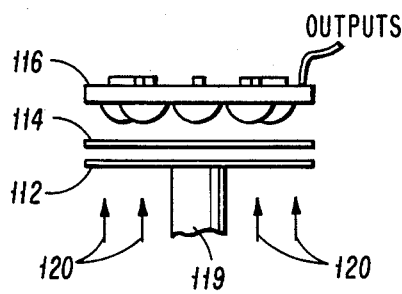
FIG 1c
COMBINED APERTURES AND SENSORS
FIG 2a
FIG 2b
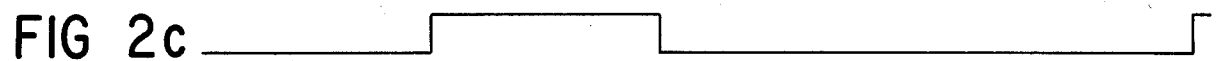
FIG 2c
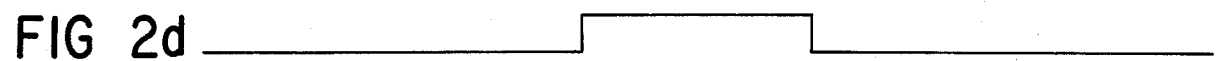
FIG 2d
FIG 2e
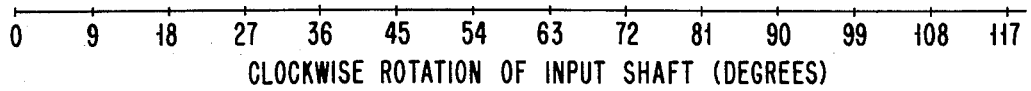
CLOCKWISE ROTATION OF INPUT SHAFT (DEGREES)

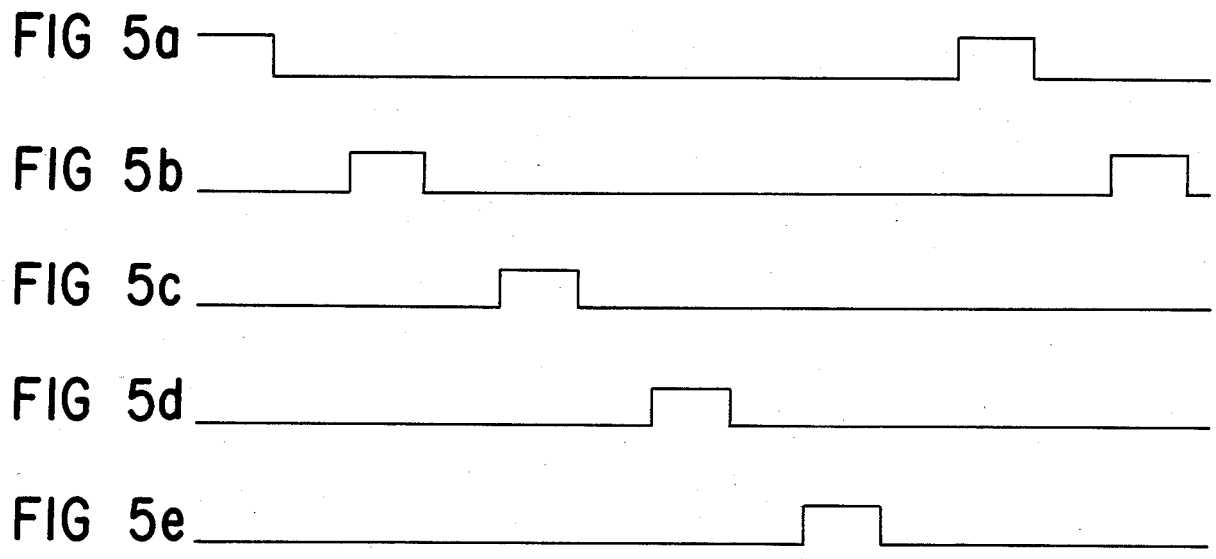

4,660,036

AMPLIFIED MOTION ENCODER

BACKGROUND OF THE INVENTION

This invention relates to precision mechanical positioning apparatus with particular application in translating physical position into an electronic format.

Encoders of various configurations have been utilized to translate information from the physical world to the electronic format required for calculation and further processing. These "sensors" have wide applicability in moving machinery and in rotating machinery in particular. Servo mechanisms, such as used in robotics and other industrial applications, have particular need for precise locating sensors which can reliably and quickly provide an input to a digital or analog control system to provide feedback knowledge with respect to current position. Thereafter, rate of change of that position as velocity is readily determined when required. Typically, an aperture is provided in a moving shutter plate which will allow light to pass between a light source and an optically sensitive sensor which will indicate the position when the aperture is properly positioned therebetween. This basic configuration has limitations in the numbers of sensors as well as the size and placement of apertures in the rotating shutterplate. Furthermore, to obtain improved resolution, a direct function is related between the numbers of apertures and sensor tracks and the resolution capability.

SUMMARY

Accordingly, it is an object of the present invention to provide a motion encoder capable of amplifying actual motion and thereby reducing the numbers of sensor tracks required. In so meeting this objective, the size of the encoder may be reduced, design simplified, and a high resolution obtained simultaneously.

Briefly, and in accordance with the present invention, a motion encoder comprises a first aperture plate having a first predetermined plurality of evenly spaced apertures therein, a second aperture plate in a spaced parallel relationship with the first aperture plate and having a second predetermined plurality of apertures evenly spaced therein, the number of the second predetermined plurality different from the first, and cooperative coupling means for movement of said first aperture plate with respect to the second aperture plate whereby select members of the plurality of apertures in the first aperture plate variably align with select members of the plurality of apertures in the second aperture plate as a direct function of the movement, wherein the variable alignment occurs at an apparent speed greater than the actual movement.

In one embodiment in accordance with the present invention, an apparent motion amplifier comprises first and second shutter means disposed in a rotatably attached and spaced parallel relationship, each having a respective plurality of apertures evenly spaced in an annular pattern, coordinated with respect to each other, one shutter having fewer apertures than the other, the first and second shutter means coincident upon a single axis of rotation and for amplifying apparent motion.

In a preferred embodiment, an amplifier as above further comprises a coarse position index aperture disposed on one of said shutter means and having a minimum size defined by the maximum number of adjacent sensors which may be simultaneously activated, plus at least one. Therefore the index aperture located on one or the other of the cooperating shutter means is constructed to incorporate at least three apertures when two adjacent sensors may be simultaneously activated. The index aperture may be larger.

Additionally a detented system may be used having a mechanical index such as a ball bearing and spring detent or an optical fine index to simplify operation.

BRIEF DESCRIPTION OF THE DRAWINGS

The operation of the present invention will become apparent to those skilled in the art upon reference to the following drawings in which:

FIGS. 1a–c are a simplified representation of one embodiment of a non-detented amplified motion encoder in accordance with the present invention.

FIGS. 2a–e are respective timing diagrams of the outputs of the sensors in FIG. 1c in proper relative positions.

FIGS. 5a–e are timing diagrams of a detented version of the present invention showing the outputs of the respective sensors in their proper relative positions.

DETAILED DESCRIPTION OF THE INVENTION

Figure 3A:
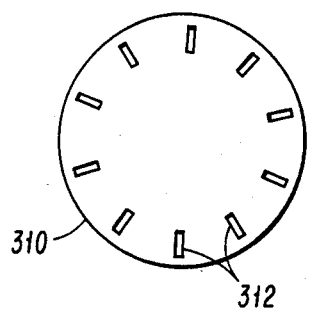
FIGS. 3a–b are the two respective shutter plates in an embodiment of the present invention having a coarse index aperture.

Referring now to FIG. 1a, the turning member of the amplified motion encoder in accordance with one implementation of the present invention, is shown in a relatively simple construction having four apertures 110 numbered 1–4 and positioned annularly in an evenly spaced pattern on aperture plate 112. The mounting provision for the rotatable input shaft is shown at 111.

Referring now to FIG. 1b, the stationary member of the aperture plate pair is shown, 114, having apertures 113 lettered A–E and shown superimposed over light sensors 115.

FIG. 1c is a combination of the turning aperture wheel 112 of FIG. 1a in combination with the stationary aperture wheel 114 shown on end. The light sensor board 116 has mounted thereon a plurality of light sensitive devices such as photocells or other optical switches, in the preferred embodiment, capable of receiving light from floodlight source 120. The rotational input shaft 119 provides movement relatively between plate 112 and plate 114, causing variable alignment of the apertures on each of the respective plates with the other apertures in accordance with the timing diagrams of FIG. 2.

Referring now to FIGS. 2a–2e, FIG. 2a shows the ON signal output by sensor and aperture combination a of FIG. 1b as a function of clockwise rotation of input shaft 119 of FIG. 1c. Likewise, FIGS. 2b–2e show the on versus off time as a function of such clockwise rotation of rotation input shaft 119, and therefore it can be seen that when shaft 119 is positioned between 0° and 9° from the starting position shown in FIG. 1a in combination with FIG. 1b, the region described as segment 210 is the combined output of the sensors on board 116 of FIG. 1c providing sensor A output high and sensors B, C, D and E, output low. When moving from 9° to 18°, in the region described by section 211, the outputs of the sensors on board 116 are as follows: sensor A and B high, sensors C, D and E low. In the region described by section 212, the outputs of the sensors are as follows: sensor A low, sensor B high, sensors C, D and E low. This pattern continues through the clockwise rotation of input shaft 119 until 90° is reached, at which point the pattern begins to repeat itself. Thus, in the embodiment shown in FIG. 1, the resolution for 90° rotation is a ten-part encodable output, resulting in a position determination having forty distinct locations for a 360° rotation of the input shaft.

One aspect of the present invention is the necessity to determine which of the repeated patterns and therefore rotational quadrants the shaft is positioned in. This is accomplished by utilizing a coarse index aperture, item 320 of FIG. 3b which will provide information as to which of the four quadrants of the 360° rotation pattern is being occupied. This coarse index aperture is required for either the detented or non-detented embodiments.

An important aspect of the present invention is the requirement to appreciate the apparent amplification of motion in that for every complete rotation of the turning aperture wheel 112, the apparent alignment of various select apertures on turning aperture wheel 112 with the stationary aperture wheel 114 and its associated apertures, will make four complete revolutions. For example, at the starting position shown in FIG. 2 by the section 210, aperture 1 on aperture wheel 112 is in direct alignment with aperture A on aperture wheel 114. This provides the high output shown in FIG. 2a between 0° and 9°. As the turning aperture wheel 112 rotates clockwise, the next aperture on wheel 112 to come into alignment with an aperture on wheel 114 will be aperture 4 which will align with aperture B. This occurs since the number of apertures on wheel 112 is less than the number of apertures on wheel 114 and, since both sets of apertures are evenly spaced, the distance between apertures on aperture wheel 112 (with fewer apertures) is greater than the distance between apertures on wheel 114 (with more). Thus, as aperture 4 aligns with aperture b, the clockwise rotation segment from 9°-18° provides for a high output from sensors A, B, and still low outputs from sensors C-E. Subsequently, aperture 1 is no longer in alignment with aperture A, but is moving into the region 18°-27°, providing the corresponding output shown by section 212. Therefore it can readily be seen that the actual motion, limited to rotation of the few degrees in actuality, results in an apparent aperture alignment and therefore amplified motion in the opposite direction on the order of four times faster than the actual movement for this embodiment.

It should be noted that a key aspect of the operation of the present invention in this regard is the difference between the numbers of apertures resulting in different distances between apertures. Additionally, the alignment of the apertures is a necessary function of the invention requiring the distance from the center of rotation for the position of each aperture set to be substantially identical.

Although described with respect to a relatively simple exemplary embodiment, it can be seen that the numbers of apertures can be increased to improve resolution, improve amplification, or reduced to accommodate sizing requirements. In this embodiment, the same pattern could have been generated by four rotations of a plate with only a single aperture on turning plate 112. This apparent amplification is therefore a function of the number of apertures as well as a function of the difference in number between the two relatively moving aperture plates.

Additionally, although an aperture described herein generally is a void in a shutter plate allowing light to pass therethrough, and as a result intercommunication is possible between an optically coupled source and sensor pair or floodlight source and photoelectric sensor combination, the present invention is equally applicable in many other sensor technologies such as Hall effect, etc., in addition to light sensors. Accordingly, the term aperture as used in this document is defined as a structure capable of stimulating a physical response in a sensor utilizing heat, light, sound, pressure, or magnetism, to produce a resulting impulse.

DESIGN CONSIDERATION

The following relationships must be maintained to build an operational encoder, providing that $n_1$ equals the number of stationary apertures/sensors, and $n_2$ equals the number of rotating aperture positions, and further defining $N_{12}$ equals the resolution of the resulting encoder, and further that $n_1$ equals $Km_1$ and $n_2$ equals $Km_2$ where $n_1$, $n_2$, $m_1$, $m_2$, $K$, and $N_{12}$ are integers, $m_1$ and $m_2$ are mutually prime, and $K$ is larger than 1. The following formula defines the relationship:

$$N_{12} = 2Km_1 m_2 = (2n_1n_2/K)$$

From the foregoing, it can be seen that $n_1$ and $n_2$ may be any two integers which are not factors of each other, and which have a common integer factor larger than one. If K is the largest common factor of $n_1$ and $n_2$, then an encoder requiring detents may be made with $(n_1 \times n_2)/K$ unique positions in a single turn. A nondetented encoder may be made with $[2(n_1 \times n_2)]/K$ unique positions. Since the nondetented encoder will still work with the detent, and since it provides twice the resolution with no additional sensors, it is a preferred embodiment.

For example, utilizing an encoder having $n_1 = 10$, and $n_2 = 12$, the resolution will be defined by $$2(2 \times 5 \times 6) = (2 \times 10 \times 12)/2 = 10 \times 12 = 120$$

This discussion has been directed toward defining the resolution which is necessarily a function of the number of apertures of one of the plates with respect to the other. It can be seen that there must exist a difference between $n_1$ and $n_2$ and that such difference is an important consideration in defining resolution and designing such an encoder.

Figure 3B:
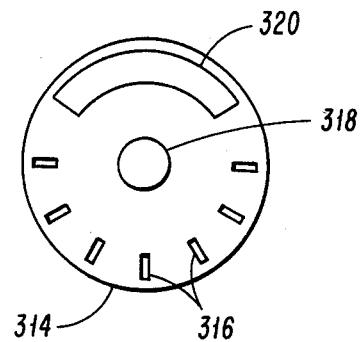

Furthermore, the need for determining which quadrant the moving aperture plate is physically located in, as in the previous example (FIG. 1, 2) leads to an additional inventive aspect of the present invention in the index aperture. Referring now to FIGS. 3a, b, the aperture plate 310 is shown having ten apertures 312 for use in combination with aperture plate 314 of FIG. 3b having a design aperture capability for twelve apertures 316, as was discussed previously. However, the combination of the coarse index requirement results in a much larger aperture incorporating five of the spaces for apertures 316 to provide for index aperture opening 320. The relative spacing of apertures 316 remains as if there were actually twelve apertures. This results in the same closer spacing of apertures 316 relative to apertures 312 to develop the amplified motion. Without the index aperture, no more than two adjacent stationary apertures 312 will be illuminated, and therefore in a high signal state, at any time. With the index aperture, and in the embodiment shown in FIG. 3b at least three adjacent apertures 312 will be open to illumination at any position of rotation of aperture plate 314 resulting in ready identification of the coarse position or quadrant location as previously discussed, as well as fine location through the amplified motion of the combination of apertures 316 with apertures 312. The required common factor of $n_1$ and $n_2$ ensures that the amplified motion pattern is duplicated K times at evenly spaced intervals around the aperture plates. This guarantees that at least one of the apertures 312 will be activated separately from those under aperture 320. Therefore this combination is a preferred embodiment which maintains a precision resolution and apparent amplified motion while eliminating the need for mechanical detent. The size of the coarse index aperture 320 must be large enough to ensure that it is readily distinguished from the normal amplified motion pattern. In a preferred embodiment with output patterns as shown in FIG. 2, this requires that the coarse index aperture be at least three positions.

It is also an object of the invention that the coarse position index aperture be aligned along the same radius of the rotating aperture plate on the individual fine position apertures, thus utilizing the same sensor for both fine and coarse position determination. Additionally, all sensors and objects should be aligned on that same radius of the aperture plates, effectively requiring only one encoding track, thus simplifying the design and manufacture of the encoders while allowing a smaller package size.

Figure 4A:
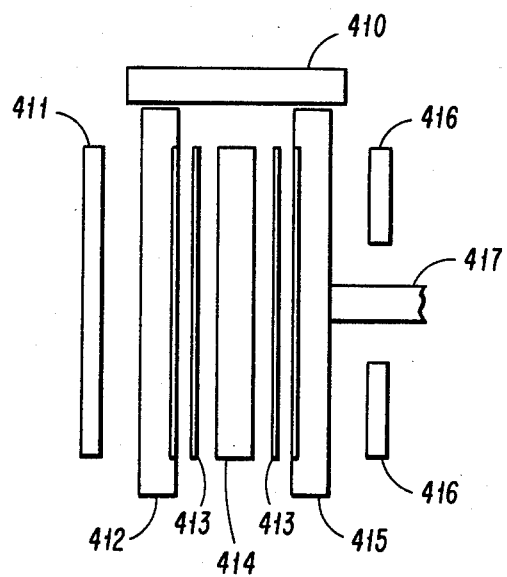
FIGS. 4a–c are an embodiment combining two amplified motion encoders in accordance with the present invention in a back-to-back configuration.
Figure 4B:
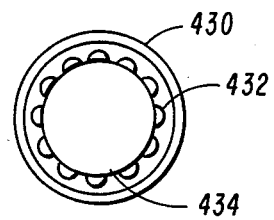
Figure 4C:
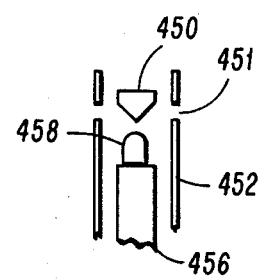

Referring now to FIG. 4a a combination of two amplified motion encoders is shown having sensor plate 414, stationary aperture plates 413, rotating aperture plate 415 geared through idler 410 to rotating aperture plate 412, and light sources 411 for lighting through the combination of rotating plate 412 and light sources 416 for lighting through the combination with rotating aperture plate 415. It is suggested that the combination of gearing through the idler 410 and rotating aperture plates 412 and 415 may be selected in accordance with principles well-known in the art to provide for any desired degree of resolution for shaft 417. A sensor construction such as shown in FIG. 4b having a reflector 430, sensors 432 and a central mounting structure 434, could be readily applied in the structure of FIG. 4a with the detail as is shown in FIG. 4c having sensor 458 mounted on a central mounting structure 456, in close proximity with rotating aperture plate 452 and the aperture 451 in alignment with reflector 450 for stimulating sensor 458. This combination facilitates ready implementation of the novel and unobvious aspects of the present invention in a wide variety of applications.

Another advantage of the present invention is that the use of the combination of two aperture plates tends to provide a parallel path to the sensors, for many of the disclosed embodiments herein. This results in a more narrowly defined light signal, and correspondingly sharper output signals.

Referring now to FIG. 5, the similarity between the timing diagrams of FIGS. 5a–e with those of FIGS. 2a–e, is intentional, so that the practitioner may readily discern the differences between the non-detented version of FIG. 2 and the detented version of FIG. 5. The ambiguity in the region 511 is eliminated by precluding a valid output while occupying this region. A mechanical detent holds the structure in regions 510, 512, etc. to eliminate the potential for the ambiguity caused by the similarity of the combined outputs in regions 9°–18°, 27°–36°, and so forth. Again, the coarse position index aperture will define the appropriate quadrant position, in this embodiment. The region 510 for the clockwise rotation of the input shaft of FIG. 1 is essentially the same output for 0°–9° rotation. However, the segment from 9°–18° shown as section 511 provides low output signals for all five sensors. Similarly, this pattern is repeated and low outputs will be received for segments from 27°–36°, 45°–54°, 63°–72°, and 81°–90°. These locations are undefined. Therefore, either a hardware detent or a fine position index may be used, as known in the art, to prevent any attempt to decode this position.

Other modifications of the disclosed embodiments may become apparent to persons skilled in the art without departing from the spirit and scope of the invention as defined by the appended claims.

I claim:

1. An apparent motion amplifier comprising first and second shutter means disposed in a rotatably attached and spaced parallel relationship, each having a respective plurality of apertures evenly spaced in an annular pattern, coordinated with respect to each other, one shutter having fewer apertures than the other, said first and second shutter means coincident on a single axis of rotation and for amplifying apparent motion, wherein one of said shutter means has a coarse position index aperture disposed thereon having a minimum size defined by the maximum number of adjacent and simultaneously activated apertures in said first shutter means, plus at least one.

2. A motion encoder comprising:
a first aperture plate having a first predetermined plurality of evenly spaced aperture therein;
a second aperture plate in a spaced parallel relationship with said first aperture plate and having a second predetermined plurality of apertures evenly spaced therein, the number of said second predetermined plurality different from said first;
cooperative coupling means for movement of said first aperture plate relative to said second aperture plate whereby select members of said plurality of apertures in said first plate variable align with select members of said plurality of apertures in said second aperture plate as a direct function of said movement wherein said variable alignment occurs at an apparent speed greater than said movement, and one of said aperture plates has a coarse position index aperture disposed thereon having a minimum size defined by the maximum number of adjacent and aligned apertures, plus at least one.

3. A motion encoder as in claim 2 further comprising means for sensing said variable alignment and for relating said variable alignment to actual movement of said first and second aperture plates.

4. A motion encoder comprising a first generally circular aperture plate having a first predetermined plurality of evenly-spaced apertures configured in an annular pattern thereon, a second generally circular aperture plate in a spaced parallel relationship with said first aperture plate, and rotatably coupled thereto, said second aperture plate having a second predetermined plurality of apertures evenly spaced in an annular pattern, the number of said second predetermined plurality different from said first, and means for sensing variable alignment of select members of said first plurality with select members of said second plurality as a function of rotation between said first and second aperture plates, and further including an index aperture located on one of said first and second aperture plates, said index aperture having a minimum size greater than the maximum number of adjacent and simultaneous illuminated apertures on said second aperture plate, plus at least one.

5. A motion encoder comprising a first generally circular aperture plate having a first predetermined plurality of evenly spaced apertures configured in an annular pattern thereon, a second generally circular aperture plate in a spaced parallel relationship with said first aperture plate, and rotatably coupled thereto, said second aperture plate having a second predetermined plurality of apertures evenly spaced in an annular pattern, the number of said second predetermined plurality different from said first, and means for sensing variable alignment of select members of said first plurality with select members of said second plurality as a function of rotation between said first and second aperture plates and including an index aperture located on one of said first and second aperture plates, said index aperture having a minimum size greater than the maximum number of adjacent and simulataneously illuminated apertures on said second aperture plate plus at least one, wherein the annular pattern of said apertures on said first and second aperture plates including said index aperture are aligned along the same radius of rotation relative to the rotational axis, thus utilizing the same annular pattern for both fine and coarse position determination, with a single index aperture.

* * * * *